(12) United States Patent
Reber

(10) Patent No.: US 6,393,070 B1
(45) Date of Patent: May 21, 2002

(54) DIGITAL COMMUNICATION DEVICE AND A MIXER

(75) Inventor: Martin Reber, Zurich (CH)

(73) Assignee: Koninklijke Philips Electronics N.V., Eindhoven (NL)

( * ) Notice: Subject to any disclaimer, the term of this patent is extended or adjusted under 35 U.S.C. 154(b) by 0 days.

(21) Appl. No.: 09/133,120

(22) Filed: Aug. 21, 1998

(30) Foreign Application Priority Data

Aug. 12, 1997 (EP) .............................. 97202492

(51) Int. Cl.[7] .............................. H03D 1/00; H04L 27/06
(52) U.S. Cl. ....................... 375/340; 375/316; 375/350; 341/157
(58) Field of Search ................................. 375/316, 324, 375/340, 350; 329/320; 341/157, 166; 708/300, 313

(56) References Cited

U.S. PATENT DOCUMENTS 5,305,004 A * 4/1994 Fattaruso ................... 341/120
5,410,498 A * 4/1995 Staver ........................ 708/313

OTHER PUBLICATIONS

Philips Data Handbook IC17, "Semiconductors for Wireless Communications" pp. 6–291 to 6–293, 6–303, 6–305. By Philips Semiconductor, 1997.

* cited by examiner

Primary Examiner—Chi Pham
Assistant Examiner—Phuong Phu
(74) Attorney, Agent, or Firm—Theo Mak

(57) ABSTRACT

A digital communication device having a dual conversion architecture. A first rf-mixing stage is provided followed by a second, quadrature, mixing stage of which output signals are sampled by means of an analog-to-digital converter and supplied to a digital signal processor (DSP) for further baseband processing. The A/D converter is a modified sigma delta analog-to-digital converter. A mixing function is added to the A/D-conversion function by modifying the input stage of a conventional sigma delta bitstream A/D converter. The result is a reduced number of IC-external components and a reduced power consumption.

7 Claims, 6 Drawing Sheets

DIGITAL COMMUNICATION DEVICE AND A MIXER

BACKGROUND OF THE INVENTION

The present invention relates to a digital communication device as claimed in the preamble of claim 1. Such a digital communication device can be a cellular or cordless phone, a pager, or any other wireless communication device.

The present invention further relates to a mixer for use in such a communication device.

A digital communication device of the above kind is known from the Philips Data Handbook IC17, "Semiconductors for Wireless Communications", pp. 6–291 to 6–293, 6–303, and 6–305, Philips Semiconductors, 1997. On page 6–305, a block diagram of a receiver is shown comprised of IC types SA1620, a receiver front-end and SA1638, an intermediate frequency I/Q transceiver, and further receiver circuitry external to these ICs such as a duplexer, a frequency synthesizer, local oscillators, and filters. This data sheet was first published on Jun. 12, 1996. The known digital communication device can be a FD/TDMA (Frequency Division/Time Division Multiple Access) GSM (Global System for Mobile Communications) transceiver, or any other suitable dual conversion receiver or transceiver. A low noise amplifier amplifies a received radio frequency signal. An output signal of the low noise amplifier is fed to a first, radio frequency, mixing stage via a bandpass filter. An output signal of the bandpass filter is filtered in a second bandpass filter, in the known device a SAW (Surface Acoustic Wave) filter operating at a relatively high intermediate frequency, for selecting a desired channel. The filtered first intermediate frequency signal is fed to analog and digital conversion means for converting the first intermediate frequency signal to base band samples of a desired base band signal comprised in the radio frequency signal. In the known communication device the analog and digital conversion means comprises an intermediate frequency amplifier of which an output is coupled to a pair of quadrature mixers, a pair of lowpass filters coupled to the mixers, and analog-to-digital converters (not shown in detail, but indicated with "to GSM baseband"). A severe drawback of this dual conversion architecture is that the channel selection filter has to be implemented using external passive components. Apart from the known communication device as described above, dual conversion receiver structures are known in which the first mixer stage mixes down the radio frequency signal to a relatively low intermediate frequency signal which is directly digitized by means of a bandpass sigma delta analog-to-digital converter. The analog-to-digital converter passes the sampled first intermediate frequency signal to a DSP (Digital Signal Processor) which performs a digital mixing down of the samples to a desired base band signal comprised in the received radio frequency signal. As compared to the architecture described in said Philips handbook, the latter architecture has the drawback that a more sophisticated and thus more complex and more power consuming analog-to-digital converter is needed. Furthermore, because the DSP has to process higher frequency signal, increased power is consumed. In modern communication devices it is highly desired to consume as few power as possible so that longer standby and useful operating times are obtained. So, increased power consumption also is a serious drawback.

SUMMARY OF THE INVENTION

It is an object of the present invention to provide a digital communication device not having the above drawbacks, i.e., a device with a reduced number of components external to ICs and with reduced power consumption.

To this end the digital communication device is characterised in that the analog and digital conversion means comprises a controllable inverter stage for multiplying the first intermediate frequency signal with a square wave, and a bit stream analog-to-digital converter coupled to an output of the controllable inverter stage. Herewith, mixing and sampling is performed as a combined operation so that advantageously the complexity and thus the cost of the analog circuitry is greatly reduced.

An embodiment is claimed in claim 2. Advantageously, the lowpass filtering characteristic of the filtering part of the sigma delta analog-to-digital converter is used for the required filtering. Advantageously, so as to further reduce the complexity of the analog circuitry, the mixing and sampling is done as claimed in claim 5. In the embodiments claimed in claim 4 as referring back to claim 3, the full advantages of the mixer/analog-to-digital converter are achieved, namely implied image rejection of unwanted signals and no feed-through of local oscillator signals.

BRIEF DESCRIPTION OF THE DRAWINGS

The present invention will now be described, by way of example, with reference to the accompanying drawings, wherein FIG. 1 schematically shows a block diagram of a digital communication device according to the present invention.

Throughout the figures the same reference numerals are used for the same elements.

DETAILED DESCRIPTION OF THE INVENTION

Figure 1:
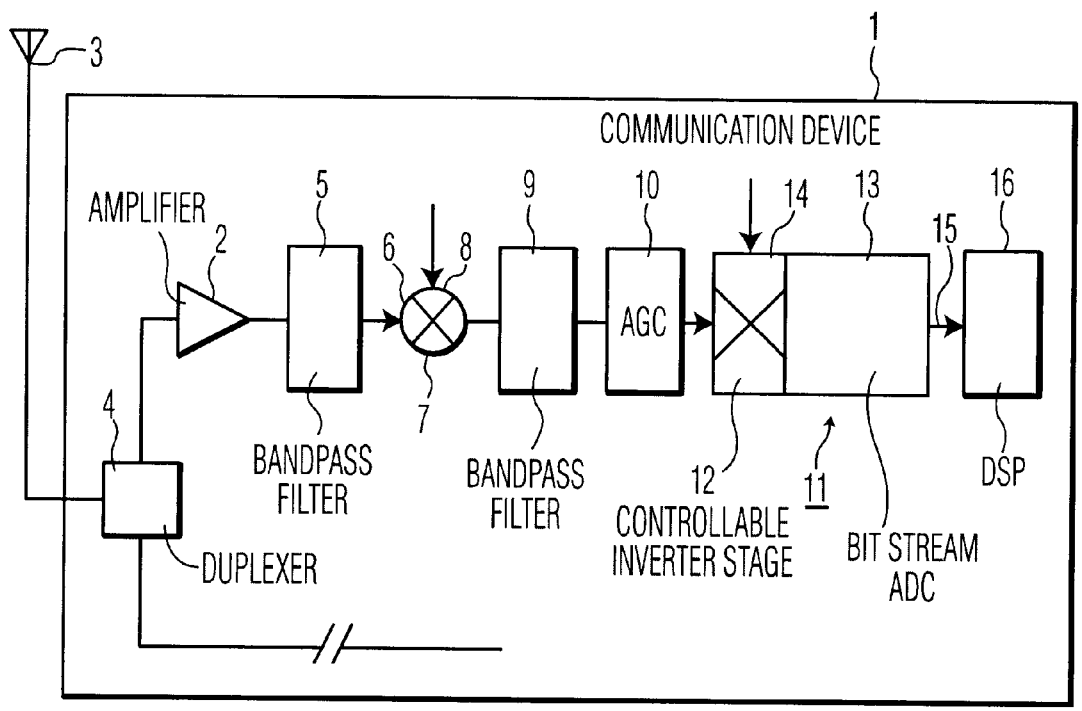

FIG. 1 schematically shows a block diagram of a digital communication device 1 according to the present invention. For simplicity, only real signals are shown, but as in the receiver disclosed in said Philips handbook, in an actual receiver I- and Q-quadrature signals are processed in the device 1. In a receive path, the digital communication device 1 comprises a low noise amplifier 2 at input side being coupled to an antenna 3 via an antenna duplexer 4. At output side, the amplifier 2 is coupled to a bandpass filter 5 which is coupled to a first input 6 of a radio frequency mixer 7. A first local oscillator signal, e.g. having a frequency of 900 MHz, is fed to a second input 8 of the mixer 7. At output side, the mixer 7 is coupled to a channel selective bandpass filter 9 which is further coupled to AGC (Automatic Gain Control) means 10. According to the present invention, analog and digital conversion means 11 are provided in the device 1, including a controllable inverter stage 12 and a bit stream analog-to-digital converter 13. A second local oscillator signal, e.g. 100 kHz, is fed to an input 14 of the controllable inverter stage 12. At an output 15 of the mixer and sampler 11, preferably samples of a base band signal comprised in the radio frequency signal are available, but in principle the samples can also be samples of a very low intermediate frequency signal resulting from the second mixing step. The baseband samples are supplied to a digital signal processor 16 for further baseband processing, as usual. As compared to architectures with direct sampling of the intermediate frequency signal, in the architecture according to the present invention, the sample rate of the samples provided to the DSP is relatively low so that processing in the DSP requires less power. Contrary to applying a relatively high intermediate frequency such as in the architecture as disclosed in said Philips handbook, in the architecture according to the present invention, a relatively low intermediate frequency is applied. It becomes thus possible to implement the channel selective filter on-chip, i.e., a substantive reduction of external components is achieved. According to the present invention, the functionality of the second mixer stage and of analog-to-digital conversion is combined. Preferably, the combined circuit is a modified sigma delta bit stream analog-to-digital converter.

Figure 2:
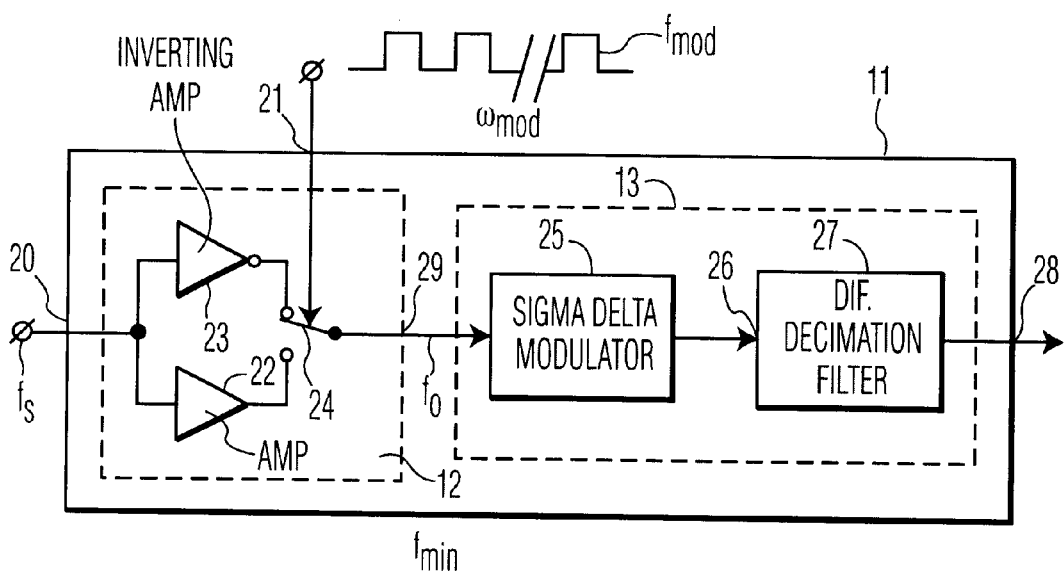
FIG. 2 shows a block diagram of a mixer and sampler according to the present invention.

FIG. 2 shows a block diagram of the mixer and sampler 11 according to the present invention. An output signal $f_s$ of the AGC means 10, the intermediate frequency signal from the RF-stage, is fed to a first input 20 of the controllable inverter stage 12 and a square wave signal $f_{mod}$ having a radian frequency $\omega_{mod}$ is fed to a second input 21 of the inverter stage 12. In principle, the controllable inverter stage behaves like a parallel coupled pair of an amplifier 22 and an inverting amplifier 23 with an output side coupled to a controlled switch 24. The switch 24 is controlled by the square wave signal $f_{mod}$. The bit stream analog-to-digital converter 13 comprises a sigma delta modulator 25 with its input side coupled to the switch 24 and its output side coupled to an input 26 of a digital decimation filter 27. The operation of such a bit stream analog-to-digital converter as such is known in the art At an output 28 of the mixer and sampler 11 base band samples are available to be further processed by the DSP 16.

The operation of the mixer and sampler 11 will now be described. The controllable inverter 12 multiplies the incoming analog signal $f_s$ by the square wave signal $f_{mod}$. At an output 29 of the switch 24, an output signal $f_o$ becomes available. For the output signal $f_o$, the following relationship holds.

$$f_o = f_s \cdot \text{sign}[f_{mod}(t)],$$

t being time and sign being the mathematical sign-function.

Assuming a single frequency input signal $f_s(t)=\cos(\omega_s t)$, $f_o$ becomes.

$$f_o(t)=(2/\pi)\cdot\sin((\omega_{mod}-\omega_s)t)+g(t),$$

wherein $$g(t)=(2/\pi)\cdot\Sigma((\sin(2n+1)\omega_{mod}t-\omega_s t)/(2n+1))+ (2/\pi)\cdot\Sigma(\sin((2n+1)\omega_{mod}t\omega_s t)/(2n+1)),$$

the first summation $\Sigma$ in g(t) being from n=1 to $\infty$, and the second summation $\Sigma$ being from n=0 to $\infty$, n being an integer.

It can easily be verified that the signal $f_o(t)$ consists of the desired down converted baseband signal and a number of higher frequency components in g(t). The lowest frequency component in g(t) is:

$$f_{min}=\min(3\cdot\omega_{mod}-\omega_s, \omega_{mod}+\omega_s),$$

min being a minimum function selecting the minimum value from two values.

The signal components with frequencies higher than $f_{min}$ should be in the stopband of the filter 27. If the filter is dimensioned such that the latter is the case, these higher frequencies just contribute to a noise signal at the output 28. The high frequency noise, which is correlated with the analog input signal $f_o$, is further attenuated by the low pass characteristic of the transfer characteristic of the sigma delta modulator 25.

Figure 3:
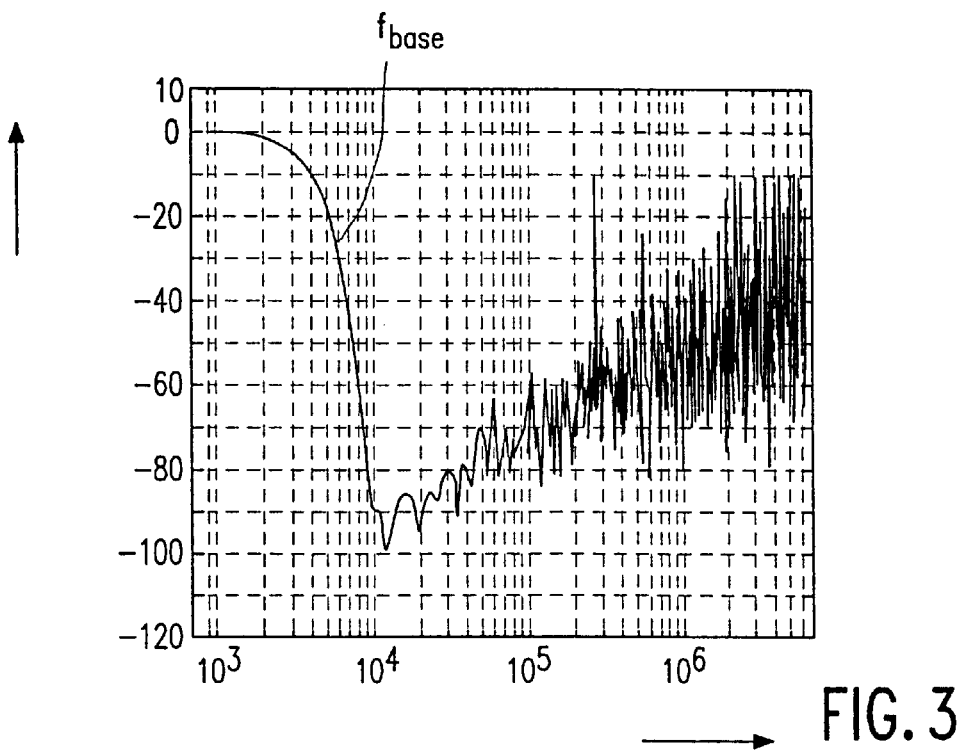
FIG. 3 shows a frequency plot of the resulting output spectrum of the bitstream of the first order sigma delta bitstream mixer according to the present invention.

FIG. 3 shows a frequency plot of the resulting output spectrum of the bitstream of the first order sigma delta bitstream mixer according to the present invention, for $f_{mod}=f_s=135$ kHz and a sample frequency of 13 MHz. The spectrum shows a base band spectrum $f_{base}$ and rapidly decaying mixer products as $f_{min}>=270$ kHz. The filter structure can be a running average filter succeeded by a FIR (Finite Impulse Response) filter. Preferably, the frequency $f_{min}$ represents a zero in the transfer function of the running average filter. Under given circumstances, it is desirable not to use the first zero in the transfer characteristic for attenuating the frequency components in g(t) but to take zeroes at higher frequencies. Then, advantage is taken from an increased attenuation by the running average filter.

In practical systems, like a GSM system, the signal $f_s(t)$ not only comprises frequency components from the selected channel but also from neighbouring channels. Then, the assumption that $f_s(t)=\cos(\omega_s t)$ is no longer valid. Harmonics in the signal $f_{mod}$ shift higher undesired frequency components in $f_s(t)$ to the desired band. Such a shifting can be avoided by selecting $\omega_{mod}>>\omega_s$ so that undesired frequency components are shift outside the band of interest, or by strictly band-limiting $f_s$ such that it holds that $\omega<\omega_s$ for all frequencies.

Figure 4:
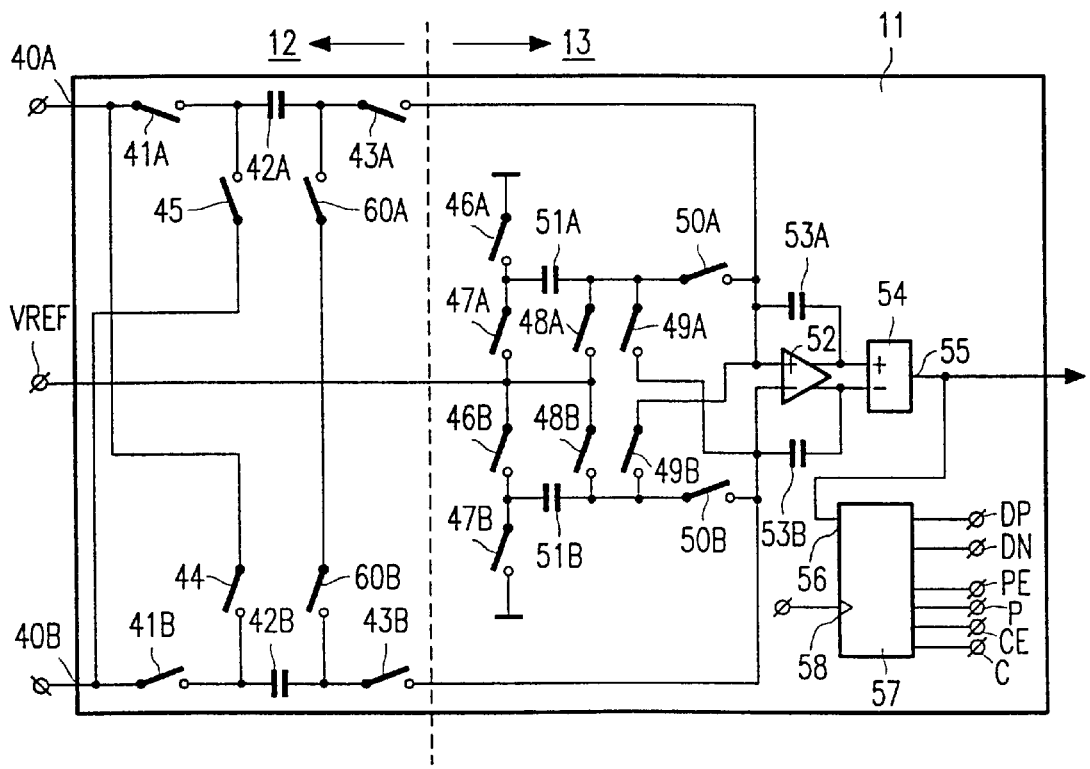
FIG. 4 shows a detailed diagram of a first order sigma delta modulator modified according to the present invention.

FIG. 4 shows a detailed diagram of a first order sigma delta modulator modified according to the present invention. The embodiment shown is in the form of a switched capacitor circuit. The switches therein are shown schematically. In an IC embodiment such switches are controlled semiconductor switches. A modified input stage 12 of the mixer and sampler 11 embodied as a balanced modified conventional sigma delta analog-to-digital converter, i.e., has differential inputs 40A and 40B, comprises a series arrangement of a switch 41A, a capacitor 42A, and a switch 43A, coupled to the input 40A, and similarly, a switch 41B, a capacitor 42B, and a switch 43B. The input 40A is coupled to a junction between the switch 41B and the capacitor 42B, via a switch 44, and the input 40B is coupled to a junction between the switch 41A and the capacitor 42A, via a switch 45. A junction between the capacitor 42A and the switch 43A is coupled to a junction between the capacitor 42B and the switch 43B, via switches 60A and 60B. The sigma delta modulator and digital decimation filter as such have a conventional construction. Shown is a first order switched capacitor sigma delta modulator comprising an arrangement of switches and capacitors comprising switches 46A, 47A, 48A, 49A, 50A and a capacitor 51A, and symmetrically switches 46B, 47B, 48B, 49B, 50B and a capacitor 51B. This arrangement is coupled to a balanced operational amplifier 52 having feedback capacitors 53A and 53B. The operational amplifier 52 is coupled to a comparator 54 at an output of which the desired data are available. An output 55 of the comparator is further fed to a data input 56 of a timing generator 57 having a clock input 58. The timing generator 57 supplies control signals to the switches of the switched capacitor input stage and modulator. A control signal C (Charge) controls the switches 47A and 47B. A control signal P (Precharge) controls the switches 46A and 46B. A control signal PE (Precharge Early) controls the switches 48A and 48B, and further the switches 60A and 60B. A control signal CE (Charge Early) controls the switches 43A and 43B. Furthermore, control signals DP and DN are available for implementing the data independent feedback loop of the sigma delta modulator. The switches 50A and 50B are controlled by the signal DP, and the switches 49A and 49B are controlled by the signal DN. When feeding back a logic "0" signal, the signal DN=CE, and when feeding back a logic "1" signal, the signal DP=CE. A reference signal VREF is coupled to a junction between the switches 46B and 47A, and to a junction between the switches 48A and 48B.

Figure 5:
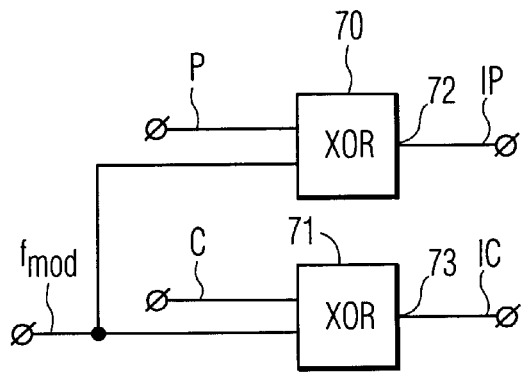
FIG. 5 shows circuitry to implement the modification.

FIG. 5 shows circuitry to implement the modification of the first order sigma delta modulator. The control signals P and C of the conventional ΣΔ-modulator are fed to inputs of respective XOR (exclusive OR-gates) 70 and 71. The signal $f_{mod}$ is fed to other inputs of XORs, these inputs being connected to each other. At respective outputs 72 and 73 of the XORs modified control signals IP and IC are available corresponding to the control signals P and C. The signals IP and IC are only used for controlling the switches 41A, 41B, 44 and 45, whereby the switches 41A and 41B are controlled by the signal IP, and the switches 44 and 45 are controlled by the signal IC. $f_{mod}$ is synchronous with the switched capacitor control signals C, CE, P and PE, which are used for controlling the remaining part of the modified switched capacitor sigma delta converter. Advantageously, $f_{mod}$ commutes only if the input switches 43A and 43B are open so that local oscillator feed-through is avoided.

The operation of such a switched capacitor sigma delta modulator as such is known and will only be described briefly. An input voltage between the inputs 40A and 40B is sampled on the input sampling capacitors 42A and 42B. The stored charge on the input capacitors is passed to the operational amplifier 52, which stores the charge on the input sampling capacitors 42A and 42B on the respective integration capacitors 53A and 53B. The charge on the integration capacitors 53A and 53B is finally processed with data dependent charge coming from the voltage VREF via the capacitors 51B and 51A in the feedback stage. Which data (a logic "0" or a logic "1") is to be processed is decided by the comparator 54. The data signal at the output 55 is passed to the timing generator 57 for generating the control signals PE, P, CE and C. The control signals in the feedback stage (DP=CE or DN=CE) are data dependent and therefore are also generated by the timing generator 57. In addition to this known analog-to-digital conversion function, a mixer function is realized by modifying the control signals P and C into the control signals IP and IC as described. The digital signal $f_{mod}$ determines the polarity of the sampled charge on the capacitors 42A and 42B. In fact the input stage acts as a Gilbert cell whereby $f_{mod}$ is a binary signal (+1, −1).

Figure 6:
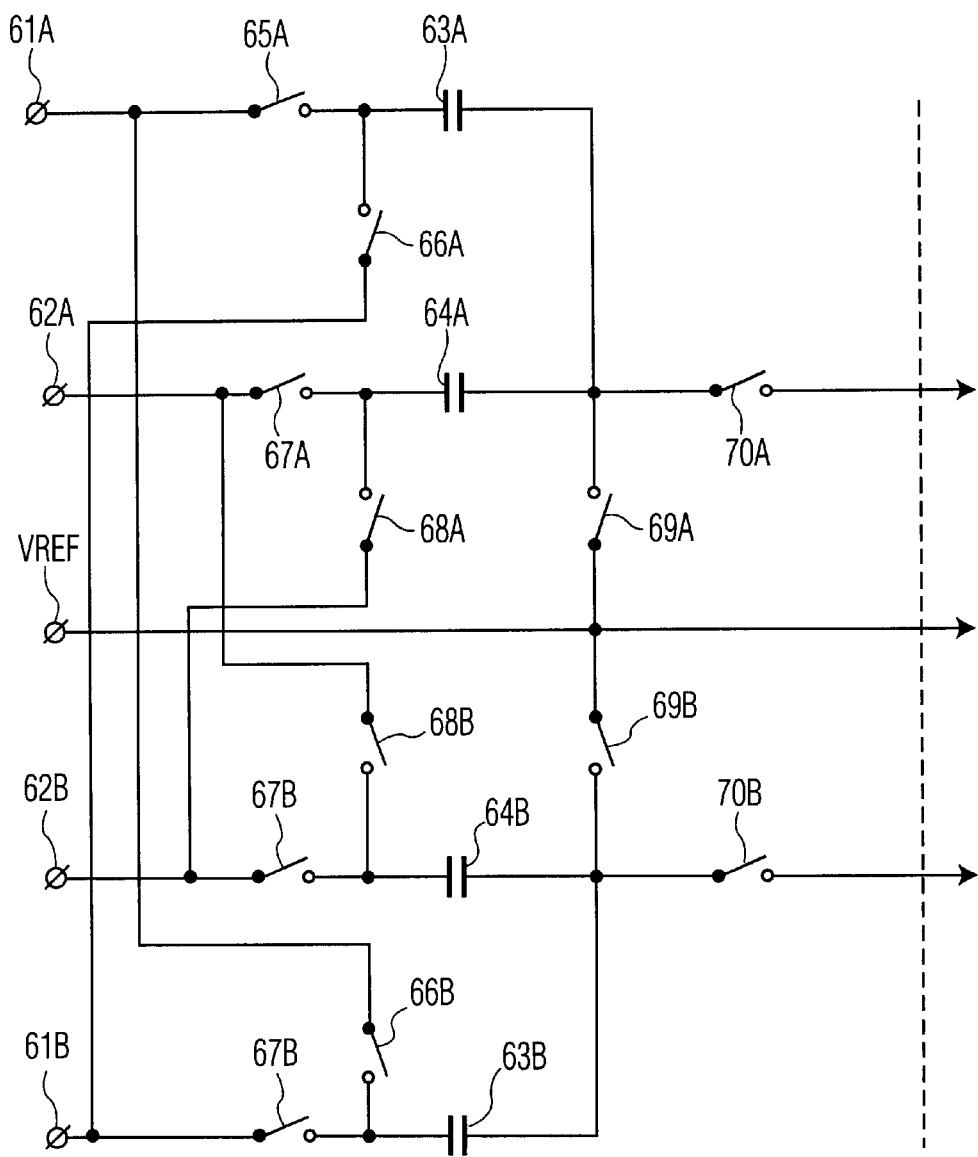
FIG. 6 shows an implied controllable input stage for complex input signals.

FIG. 6 shows an implied controllable input stage for complex input signals. Components of a complex intermediate frequency signal are differentially available between terminals 61A and 61B, and terminals 62A and 62B, respectively. The complex components, usually referred to as I- and Q-signals are switched to capacitors 63A and 63B, and to capacitors 64A and 64B, respectively. To this end, switches 65A and 65B, 66A and 66B, 67A and 67B, and 68A and 68B are comprised in modified input circuitry of a switched capacitor sigma delta modulator. Furthermore, switches 69A and 69B, and 70A and 70B are comprised in the input circuitry, controlled by the unmodified control signals PE and CE, respectively. For the complex implementation two of such modified switched capacitor sigma delta convertors are needed for generating I- and Q- data output signals. At the right of the dashed line the complex mixer comprises circuitry similar to the circuit 13 shown in FIG. 4, albeit in two-fold.

Figure 7:
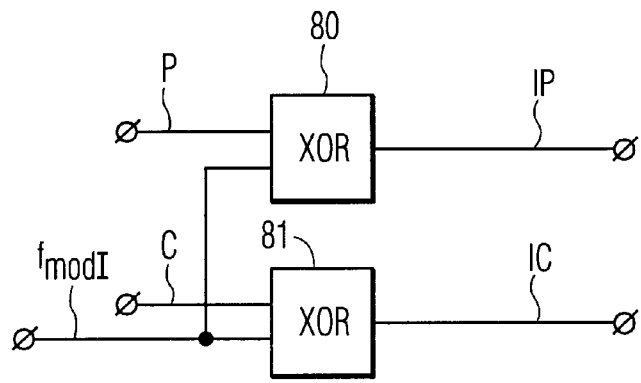
FIGS. 7 to 9 show circuitry to implement the complex modification.
Figure 8:
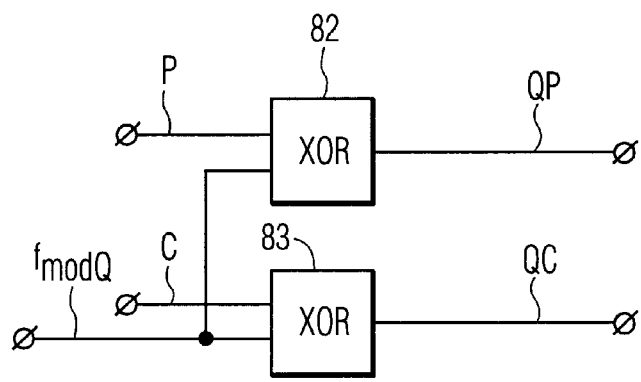
Figure 9:
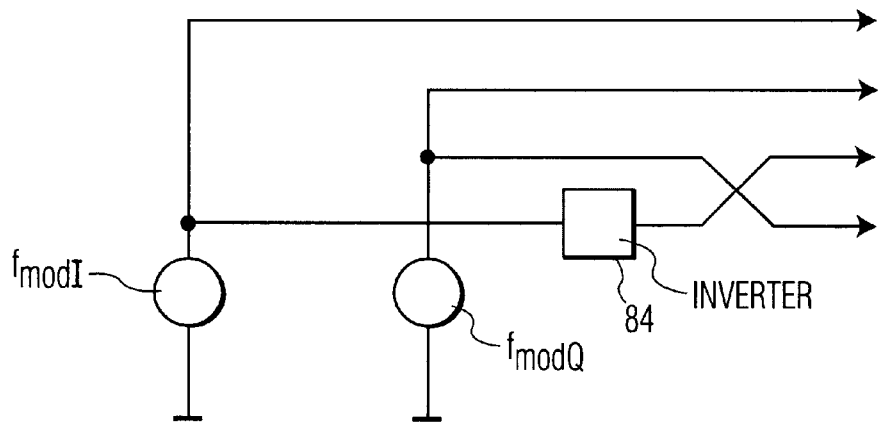

FIG. 7 to 9 show circuitry to implement the complex modification.

FIGS. 7 and 8 show circuits similar to the circuit of FIG. 5. The circuit of FIG. 7 is comprised of two XORs 80 and 81, and the circuit of FIG. 8 is comprised of two XORs 82 and 83. To the circuits of FIGS. 7 and 8 quadrature local oscillator signals $f_{modI}$ and $f_{modQ}$ are supplied. The circuit of FIG. 7 generates in phase control signals IP and IC from the control signals P and C, and the circuit of FIG. 8 generates quadrature control signals from the control signals P and C. The signal IP controls the switches 65A and 65B, the signal IC controls the switches 66A and 66B, the signal QP controls the switches 67A and 67B, and the signal QC controls the switches 68A and 68B.

FIG. 9 shows switching of the quadrature oscillator signals $f_{modI}$ and $f_{modQ}$ to the complex mixer architecture. The signals $f_{modI}$ and $f_{modQ}$ are directly fed to respective quadrature inputs for local oscillator signals as shown in FIGS. 7 and 8. Herewith, the corresponding mixer/analog-to-digital converter generates in phase baseband samples at a data output. For controlling the quadrature part of the mixer, first the signal $f_{modI}$ is inverted by an inverter 84, and then the inverted $f_{modI}$ signal and the non-inverted signal $f_{modQ}$ are fed to similar circuitry as of FIGS. 7 and 8 in a cross-coupled way.

Figure 10:
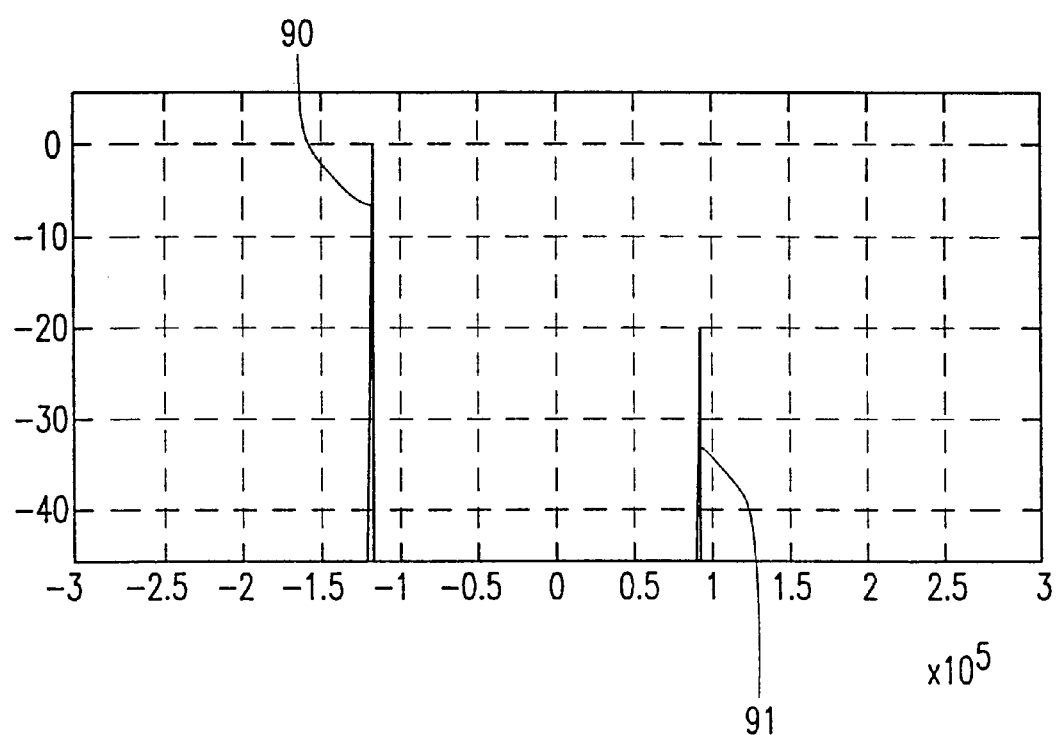
FIG. 10 shows a complex input spectrum at an input of the complex mixer.

FIG. 10 shows a complex input spectrum at the inputs 61A and 61B, 62A and 62B of the quadrature part, and at corresponding inputs at the in phase part of the complex mixer. The magnitude of the input spectrum is plotted as a function of frequency. The complex input spectrum shows an wanted channel 90 and an adjacent or neighbouring channel 91. The complex mixer should shift the wanted channel to the right and reject the adjacent channel. In the given example where the local oscillator frequency is 100 kHz, the wanted channel will be shifted from −120 kHz to −20 kHz.

Figure 11:
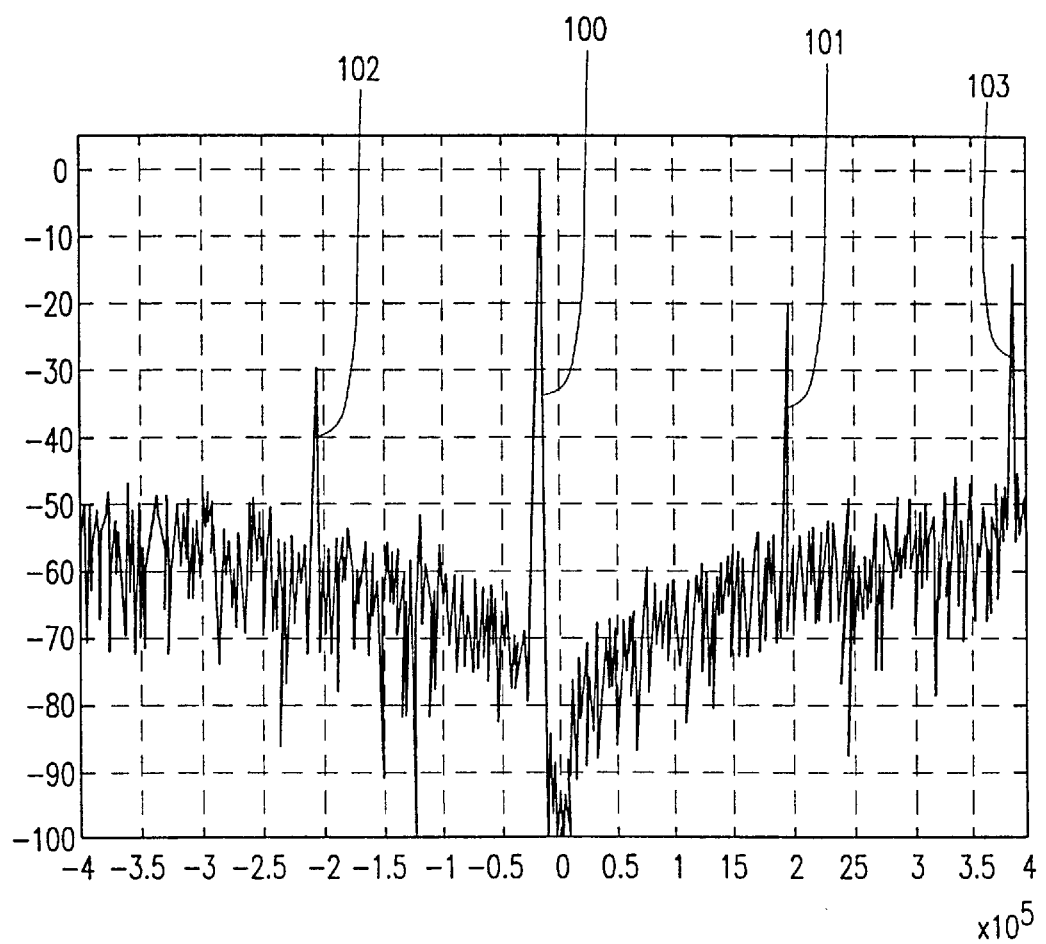
FIG. 11 shows a Fast Fourier Transform of a complex bitstream of down-converted complex input signals.

FIG. 11 shows a Fast Fourier Transform of a complex bitstream of down-converted complex input signals. At the horizontal axis frequency is shown in Herz. Vertically, the magnitude of the FFT of the complex bitstream is shown. As can be seen in the spectrum, the wanted input signal as shown in FIG. 10 has been shifted to the right. Frequency peaks of the input signal are indicated with reference numerals 100 and 101. Distortion peaks due to mixing with a square wave are indicated with reference numerals 102 and 103. Thus, the complex mixer according to the present invention achieves an implied image rejection of unwanted signals generated in the mixing process. Because of the use of switched capacitor logic, no local oscillator signal feed-through occurs.

In view of the foregoing it will be evident to a person skilled in the art that various modifications may be made within the spirit and the scope of the present invention as hereinafter defined by the appended claims and that the present invention is thus not limited to the examples provided.

What is claimed is:

1. A digital communication device comprising:

a receiver front-end for receiving a radio frequency signal, which receiver front-end has a first mixer stage for mixing down the radio frequency signal to a first intermediate frequency signal;

analog and digital conversion means for converting the first intermediate frequency signal to baseband signal samples of a desired baseband signal comprised in the radio frequency signal, the analog and digital conversion means comprising a controllable inverter stage for combining the first intermediate frequency signal with a square wave signal having a frequency approximately equal to a modulation frequency, and a bit stream analog-to-digital converter coupled to an output of the controllable inverter stage, which bit stream analog-to-digital converter is a switched capacitor sigma analog-to-digital converter comprising a switched capacitor sigma delta modulator coupled to a digital decimation filter, the digital decimation filter filtering out undesired frequency components in an output spectrum of an output signal of the controllable inverter stage, the controllable inverter stage being implemented by dedicated control signals for controlling the switched capacitor sigma delta modulator.

2. A digital communication device as claimed in claim 1, wherein the bit stream analog-to-digital converter is a complex converter comprised of two sigma delta converters having modified input stages and dedicated local oscillator signals.

3. A digital communication device as claimed in claim 1, wherein the analog and digital conversion means is a modified conventional sigma delta converter having an input stage modified so as to include the controllable inverter stage, the modified conventional sigma delta converter functionally being a second mixer stage combined with a sampler for mixing down the first intermediate frequency signal to a baseband signal or very low intermediate frequency signal and for sampling the mixed down signal.

4. A digital communication device as claimed in claim 1, wherein the digital decimation filter is a running average filter succeeded by a finite impulse response filter so as to perform low pass filtering, having zeroes at unwanted harmonics due to mixing down with a square-wave signal.

5. A mixer comprising:

analog and digital conversion means for converting a first intermediate frequency signal in a communication device to baseband signal samples of a desired baseband signal comprised in a radio frequency signal received by the communication device, the analog and digital conversion means comprising a controllable inverter stage for combining the first intermediate frequency signal with a square wave signal having a frequency approximately equal to a modulation frequency, and a bit stream analog-to-digital converter coupled to an output of the controllable inverter stage, which bit stream analog-to-digital converter is a switched capacitor sigma analog-to-digital converter comprising a switched capacitor sigma delta modulator coupled to a digital decimation filter, the digital decimation filter filtering out undesired frequency components in an output spectrum of an output signal of the controllable inverter stage, the controllable inverter stage being implemented by dedicated control signals for controlling the switched capacitor sigma delta modulator.

6. A mixer according to claim 5, wherein the mixer is a quadrature mixer.

7. A mixer comprising:

analog and digital conversion means for converting a first intermediate frequency signal in a communication device to baseband signal samples of a desired baseband signal comprised in a radio frequency signal received by the communication device, the analog and digital conversion means comprising a controllable inverter stage for combining the first intermediate frequency signal with a square wave signal, and a bit stream analog-to-digital converter coupled to an output of the controllable inverter stage, which bit stream analog-to-digital converter is a switched capacitor sigma analog-to-digital converter comprising a switched capacitor sigma delta modulator coupled to a digital decimation filter, the digital decimation filter filtering out undesired frequency components in an output spectrum of an output signal of the controllable inverter stage, the controllable inverter stage being implemented by dedicated control signals for controlling the switched capacitor sigma delta modulator.

* * * * *